United States Patent
Akasaka

(10) Patent No.: US 8,705,167 B2
(45) Date of Patent: Apr. 22, 2014

(54) SYSTEM AND METHOD FOR COMPENSATING FOR POLARIZATION DEPENDENT LOSS

(75) Inventor: Youichi Akasaka, Allen, TX (US)

(73) Assignee: Fujitsu Limited, Kawasaki-shi (JP)

( * ) Notice: Subject to any disclaimer, the term of this patent is extended or adjusted under 35 U.S.C. 154(b) by 796 days.

(21) Appl. No.: 12/868,205

(22) Filed: Aug. 25, 2010

(65) Prior Publication Data
US 2012/0050846 A1  Mar. 1, 2012

(51) Int. Cl.
*H01S 3/13* (2006.01)
*H04B 10/293* (2013.01)
*H01S 3/10* (2006.01)

(52) U.S. Cl.
CPC ............ *H01S 3/1308* (2013.01); *H04B 10/293* (2013.01); *H01S 3/1301* (2013.01); *H01S 3/1305* (2013.01); *H01S 3/10015* (2013.01)
USPC ...................................... 359/341.4

(58) Field of Classification Search
CPC ............ H01S 3/06754; H01S 3/10061; H01S 3/10015; H04B 10/0795; H04B 10/0797; H04B 10/2572
USPC ..................... 359/337; 398/177, 65
See application file for complete search history.

(56) References Cited

U.S. PATENT DOCUMENTS

| | | | | |
|---|---|---|---|---|
| 4,272,194 A * | 6/1981 | Gievers | ........................ | 356/470 |
| 5,471,334 A * | 11/1995 | Masuda et al. | ................ | 359/337 |
| 5,481,391 A * | 1/1996 | Giles | ........................... | 359/337 |
| 5,500,762 A * | 3/1996 | Uchiyama et al. | ........... | 359/326 |
| 5,841,557 A * | 11/1998 | Otsuka et al. | .................. | 398/65 |
| 5,894,532 A * | 4/1999 | Moores | ......................... | 385/11 |
| 6,049,415 A * | 4/2000 | Grubb et al. | ............... | 359/341.1 |
| 6,130,766 A * | 10/2000 | Cao | ................................ | 398/147 |
| 6,310,720 B1 * | 10/2001 | Walker et al. | ................ | 359/344 |
| 6,552,836 B2 * | 4/2003 | Miller | .......................... | 359/237 |
| 6,587,421 B1 * | 7/2003 | Wilde et al. | ............. | 369/112.01 |
| 6,650,797 B2 * | 11/2003 | Naganuma | ........................ | 385/11 |
| 6,728,491 B1 * | 4/2004 | Ooi et al. | ...................... | 398/147 |
| 6,760,149 B2 * | 7/2004 | Roberts et al. | ............... | 359/337 |
| 6,762,837 B2 * | 7/2004 | Iwata | ........................... | 356/368 |

(Continued)

OTHER PUBLICATIONS

Phua et al.; "A Deterministic Broad-Band Polarization-Dependent Loss Compensator"; Journal of Lightwave Technology, vol. 23, No. 2; pp. 771-780, Feb. 2005.

(Continued)

*Primary Examiner* — Mark Hellner
*Assistant Examiner* — Ari M Diacou
(74) *Attorney, Agent, or Firm* — Baker Botts L.L.P.

(57) ABSTRACT

In accordance with one embodiment of the present disclosure a system for compensating for polarization dependent loss experienced by an optical signal comprises an optical amplifier configured to amplify an optical signal and having a polarization dependent gain (PDG). The system also comprises a polarization rotator coupled to the amplifier and configured to rotate the polarization of the optical signal before the signal enters the amplifier. The system also comprises a polarization dependent loss (PDL) controller coupled to the amplifier and the rotator. The PDL controller may be configured to determine a post-amplifier PDL of the optical signal as the signal leaves the optical amplifier. The PDL controller may also be configured to control the rotator to rotate the polarization of the optical signal based on the post-amplifier PDL, such that the PDG of the amplifier compensates for the PDL experienced by the optical signal.

19 Claims, 4 Drawing Sheets

(56) References Cited

U.S. PATENT DOCUMENTS

| | | | |
|---|---|---|---|
| 6,792,168 B2* | 9/2004 | Lanne et al. | 385/11 |
| 7,088,743 B2* | 8/2006 | Rice et al. | 372/6 |
| 7,206,466 B2* | 4/2007 | He et al. | 385/11 |
| 7,206,517 B1* | 4/2007 | Yu et al. | 398/152 |
| 7,268,936 B2* | 9/2007 | Onaka et al. | 359/341.41 |
| 7,447,441 B2* | 11/2008 | Alleston et al. | 398/152 |
| 7,450,298 B2* | 11/2008 | Watanabe | 359/333 |
| 7,835,643 B2* | 11/2010 | Futami et al. | 398/25 |
| 8,073,326 B2* | 12/2011 | Yan et al. | 398/30 |
| 2002/0176080 A1* | 11/2002 | Iwata | 356/369 |
| 2003/0039426 A1* | 2/2003 | Lanne et al. | 385/11 |
| 2003/0081292 A1* | 5/2003 | Mikami et al. | 359/161 |
| 2004/0125435 A1* | 7/2004 | Liu et al. | 359/337 |
| 2004/0190906 A1* | 9/2004 | Jain | 398/147 |
| 2005/0002099 A1* | 1/2005 | He et al. | 359/494 |
| 2005/0201429 A1* | 9/2005 | Rice et al. | 372/27 |
| 2005/0213990 A1* | 9/2005 | Watanabe | 398/177 |
| 2005/0226632 A1* | 10/2005 | Alleston et al. | 398/152 |
| 2007/0216993 A1* | 9/2007 | Aiso et al. | 359/340 |
| 2007/0223078 A1* | 9/2007 | Yao et al. | 359/259 |
| 2010/0098420 A1* | 4/2010 | Ibragimov et al. | 398/65 |
| 2010/0239245 A1* | 9/2010 | Yao | 398/27 |
| 2011/0051143 A1* | 3/2011 | Flanders et al. | 356/451 |
| 2011/0255874 A1* | 10/2011 | Watanabe | 398/178 |

OTHER PUBLICATIONS

Das et al.; "Broadband, Adjustable Polarization-Dependent-Loss Compensators with Long-period Fiber-gratings"; Gratings and Filters II, Apr. 5, 2010.

Kim et al.; "Novel PDL/PDG compensator for transmission optical devices using Sagnac interferometer"; OFK7; pp. 3, 2004.

Hentschel et al.; "PDL Measuring using the Agilent 8169A Polarization Controller"; Agilent Technologies; pp. 14, Jan. 9, 2002.

Sun et al.; "Statistics of the System Performance in a Scrambled Recirculating Loop With PDL and PDG"; IEEE Photonics Technology Letters, vol. 15 No. 8; pp. 1067-1069, Aug. 2003.

Cho et al.; "Analysis and Optimization of Polarization-Insensitive Semiconductor Optical Amplifiers with Delta-Strained Quantum Wells"; IEEE Journal of Quantum Electronics, vol. 37, No. 4; pp. 574-579, Apr. 2001.

* cited by examiner

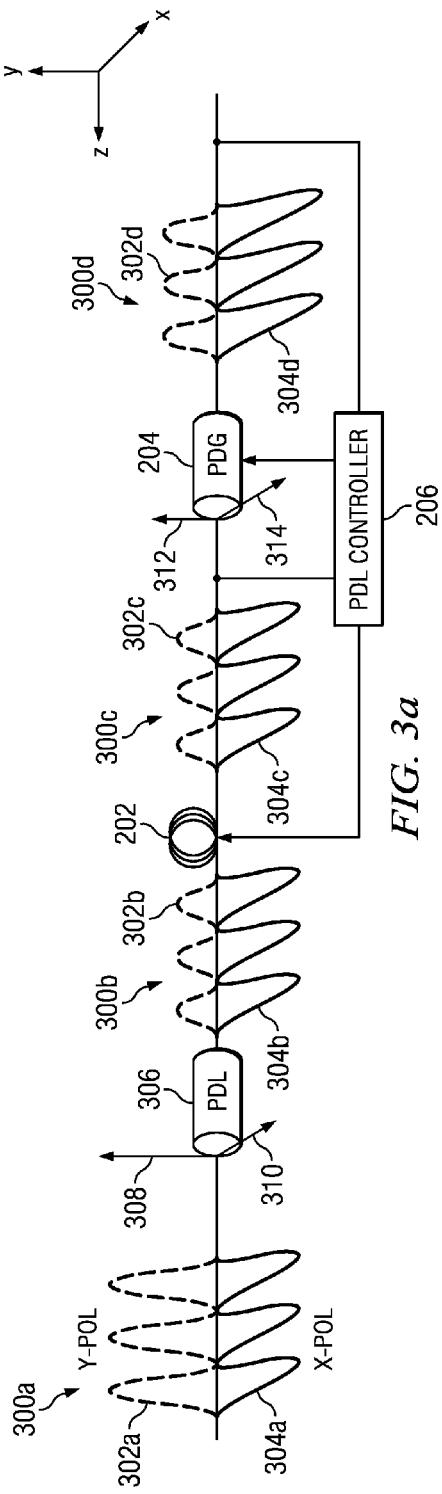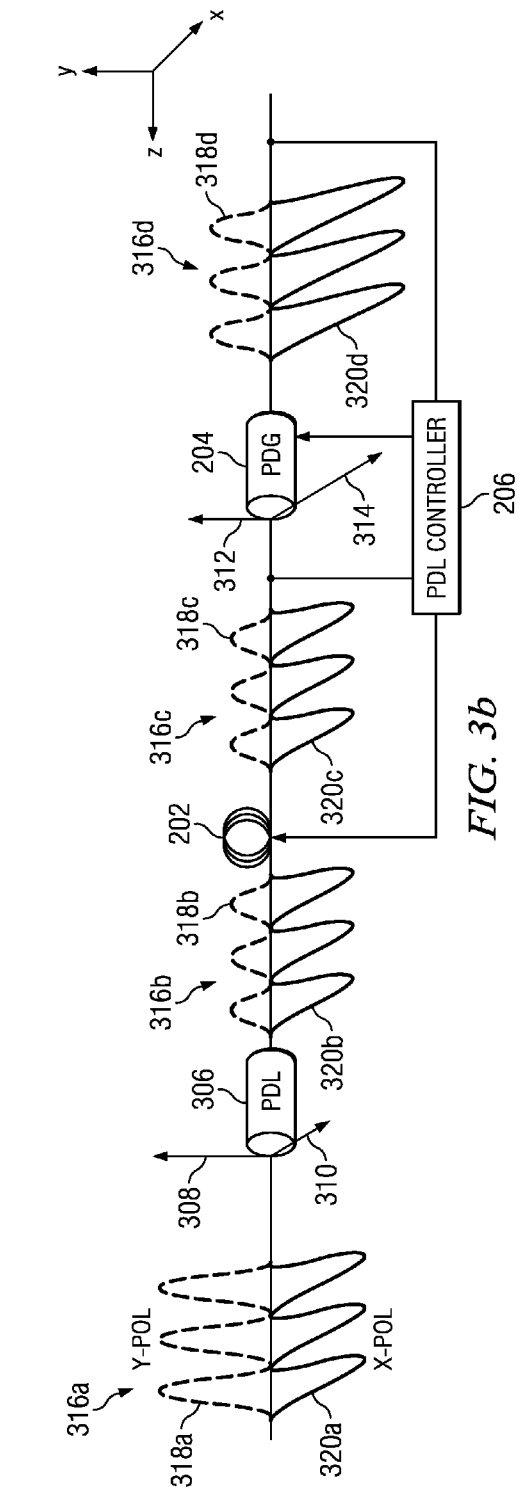
FIG. 3a
FIG. 3b

SYSTEM AND METHOD FOR COMPENSATING FOR POLARIZATION DEPENDENT LOSS

TECHNICAL FIELD

The present disclosure relates generally to optical communication networks and, more particularly, to a system and method for compensating for the effects of polarization dependent loss in a system.

BACKGROUND

Telecommunications systems, cable television systems and data communication networks use optical networks to rapidly convey large amounts of information between remote points. In an optical network, information is conveyed in the form of optical signals through optical fibers. Optical networks may also include various network elements such as amplifiers, dispersion compensators, multiplexer/demultiplexer filters, wavelength selective switches, couplers, etc. configured to perform various operations within the network.

However, each of these network elements may also introduce polarization dependent effects on the signals traveling through the network. These effects may cause the various components of the polarization states of the signals to experience varying degrees of loss or gain, thus causing unequal power levels of the various polarization components of the signals. This inequality of power may cause information or data carried by the signals to become distorted or lost.

SUMMARY

In accordance with the present disclosure disadvantages and problems associated with polarization dependent loss in an optical network may be reduced.

In accordance with one embodiment of the present disclosure a system for compensating for polarization dependent loss experienced by an optical signal comprises an optical amplifier configured to amplify an optical signal and having a polarization dependent gain (PDG). The system also comprises a polarization rotator coupled to the amplifier and configured to rotate the polarization of the optical signal before the signal enters the amplifier. The system also comprises a polarization dependent loss (PDL) controller coupled to the amplifier and the rotator. The PDL controller may be configured to determine a post-amplifier PDL of the optical signal as the signal leaves the optical amplifier. The PDL controller may also be configured to control the rotator to rotate the polarization of the optical signal based on the post-amplifier PDL, such that the PDG of the amplifier compensates for the PDL experienced by the optical signal.

In accordance with another embodiment of the present disclosure a method for compensating for polarization dependent loss experienced by an optical signal comprises determining a post-amplifier polarization dependent loss (PDL) of a signal leaving an optical amplifier having a polarization dependent gain (PDG). The method further comprises rotating the polarization of the optical signal based on the post-amplifier PDL such that the PDG of the amplifier compensates for the PDL experienced by the signal.

BRIEF DESCRIPTION OF THE DRAWINGS

For a more complete understanding of the present disclosure and its features and advantages, reference is now made to the following description, taken in conjunction with the accompanying drawings, in which:

FIG. 3a illustrates the effects of polarization dependent loss (PDL) on a signal;

FIG. 3b illustrates adjustments of the polarization dependent gain (PDG) of an amplifier to help compensate for PDL;

DETAILED DESCRIPTION

Figure 1:
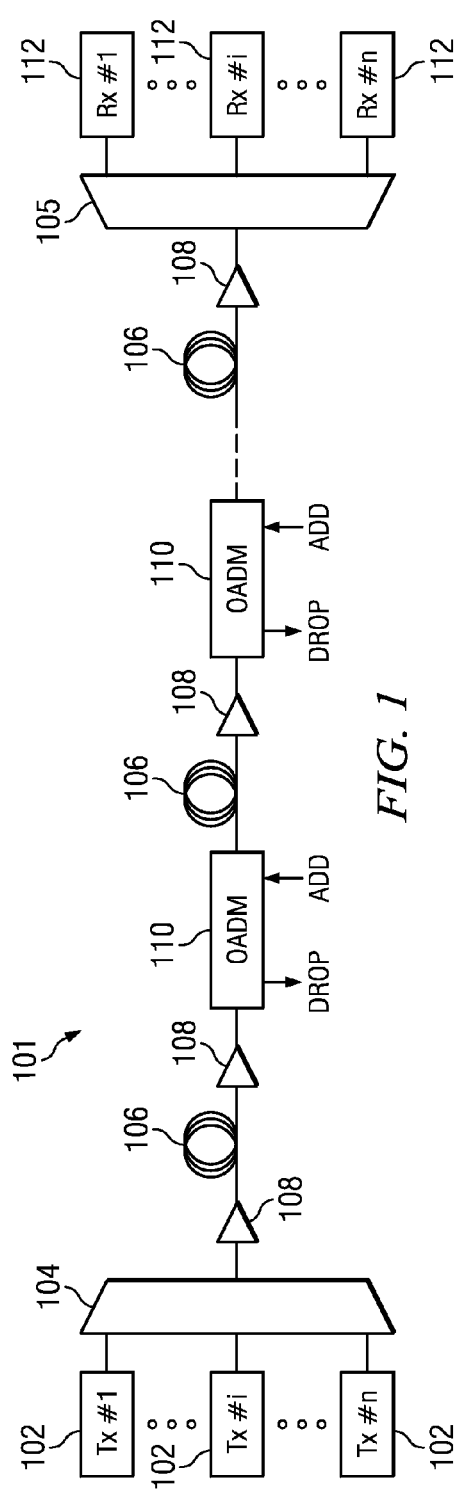
FIG. 1 illustrates an example embodiment of an optical network.

FIG. 1 illustrates an example embodiment an optical network 101. Optical network 101 may include one or more optical fibers 106 configured to transport one or more optical signals communicated by components of optical network 101. The network elements of optical network 101, coupled together by fibers 106, may comprise one or more transmitters 102, one or more multiplexers (MUX) 104, one or more amplifiers 108, one or more optical add/drop multiplexers (OADM) 110, and one or more receivers 112.

Optical network 101 may comprise a point-to-point optical network with terminal nodes, a ring optical network, a mesh optical network, or any other suitable optical network or combination of optical networks. Optical fibers 106 comprise thin strands of glass capable of communicating the signals over long distances with very low loss. Optical fibers 106 may comprise any suitable type of fiber, such as a Single-Mode Fiber (SMF), Enhanced Large Effective Area Fiber (ELEAF), or a TrueWave® Reduced Slope (TW-RS) fiber.

Optical network 101 may include devices configured to transmit optical signals over fibers 106. Information may be transmitted and received through network 101 by modulation of one or more wavelengths of light to encode the information on the wavelength. In optical networking, a wavelength of light may also be referred to as a channel. Each channel may be configured to carry a certain amount of information through optical network 101.

To increase the information carrying capabilities of optical network 101, multiple signals transmitted at multiple channels may be combined into a single optical signal. The process of communicating information at multiple channels of a single optical signal is referred to in optics as wavelength division multiplexing (WDM). Dense wavelength division multiplexing (DWDM) refers to the multiplexing of a larger (denser) number of wavelengths, usually greater than forty, into a fiber. WDM, DWDM, or other multi-wavelength transmission techniques are employed in optical networks to increase the aggregate bandwidth per optical fiber. Without WDM or DWDM, the bandwidth in optical networks may be limited to the bit-rate of solely one wavelength. With more bandwidth, optical networks are capable of transmitting greater amounts of information. Optical network 101 may be configured to transmit disparate channels using WDM, DWDM, or some other suitable multi-channel multiplexing technique, and to amplify the multi-channel signal.

Optical network 101 may include one or more optical transmitters (Tx) 102 configured to transmit optical signals through optical network 101 in specific wavelengths or channels. Transmitters 102 may comprise any system, apparatus or device configured to convert an electrical signal into an optical signal and transmit the optical signal. For example, transmitters 102 may each comprise a laser and a modulator configured to receive electrical signals and modulate the information contained in the electrical signals onto a beam of light produced by the laser at a particular wavelength and transmit the beam carrying the signal throughout the network.

Multiplexer 104 may be coupled to transmitters 102 and may be any system, apparatus or device configured to combine the signals transmitted by transmitters 102, in individual wavelengths, into a single WDM or DWDM signal.

Amplifiers 108 may amplify the multi-channeled signals within network 101. Amplifiers 108 may be positioned before and/or after certain lengths of fiber 106. Amplifiers 108 may comprise any system, apparatus, or device configured to amplify signals. For example, amplifiers 108 may comprise an optical repeater that amplifies the optical signal. This amplification may be performed with opto-electrical or electro-optical conversion. In some embodiments, amplifiers 108 may comprise an optical fiber doped with a rare-earth element. When a signal passes through the fiber, external energy may be applied to excite the atoms of the doped portion of the optical fiber, which increases the intensity of the optical signal. As an example, Amplifiers 108 may comprise an erbium-doped fiber amplifier (EDFA). However, any other suitable amplifier, such as a semiconductor optical amplifier (SOA), may be used.

OADMs 110 may be coupled to network 101 via fibers 106 also. OADMs 110 comprise an add/drop module, which may include any system, apparatus or device configured to add and/or drop optical signals from fibers 106. After passing through an OADM 110, a signal may travel along fibers 106 directly to a destination, or the signal may be passed through one or more additional OADMs 110 before reaching a destination.

Network 101 may also include one or more demultiplexer 105 at one or more destinations of network 101. Demultiplexer 105 may comprise any system apparatus or device that may act as a demultiplexer by splitting a single WDM signal into its individual channels. In some embodiments, demultiplexer 105 may comprise a multiplexer 104 but configured to split WDM signals into their individual channels instead of combine individual channels into one WDM signal. For example, network 101 may transmit and carry a forty channel DWDM signal. Demultiplexer 105 may divide the single, forty channel DWDM signal into forty separate signals according to the forty different channels.

Network 101 may also include receivers 112 coupled to demultiplexer 105. Each receiver 112 may be configured to receive signals transmitted in a particular wavelength or channel, and process the signals for the information that they contain. Accordingly, network 101 may include at least one receiver 112 for every channel of the network.

As discussed above, the amount of information that may be transmitted over an optical network may vary with the number of optical channels coded with information and multiplexed into one signal. Accordingly, an optical signal employing WDM may carry more information than an optical signal carrying information over solely one channel. An optical signal employing DWDM may carry even more information. Besides the number of channels carried, another factor that affects how much information can be transmitted over an optical network may be the bit rate of transmission. The greater the bit rate, the more information may be transmitted.

Multi-polarization technology may enable achieving a greater bit rate for information transmission. Multi-polarization transmission may comprise modulating information onto various polarization components of an optical wavelength. For example, in dual polarization transmission, information may be modulated onto two separate polarization components of a wavelength, thus increasing the amount of information that may be carried by the wavelength over any given time (e.g., increasing the bit rate).

However, the various elements in optical networks may affect the various polarization state components of optical signals in different manners. For example, fibers 106, multiplexers 104, demultiplexers 105, and add/drop modules 110 may attenuate signals as the signals pass through these elements. These elements may attenuate the various polarization components of the signals differently, thus causing a polarization dependent loss (PDL). For example, a fiber 106 may attenuate the y-polarization component of a signal greater than it may attenuate the x-polarization component of the same signal. Similarly, amplifiers may amplify the various polarization components of a signal differently, thus, causing a polarization dependent gain (PDG). Additionally, these polarization dependent effects may change according to the wavelength or channel of the signals passing through the components.

Polarization dependent effects of a network may constantly be changing also. Due to switching within networks, different signals may pass through different components that may create different polarization dependent effects on different signals. Additionally, environmental and physical factors such as bending and moving of fibers may also change the polarization dependent effects experienced by signals traveling through a network.

These polarization dependent effects may cause the different polarization states of the multi-polarization signals to be amplified and attenuated at varying degrees, which may cause signal distortion and loss of information. Although these effects of the various components may result from both PDL and PDG, the overall result of the effects may be referred to simply as PDL.

The non-linear and wavelength dependent nature of PDL makes PDL difficult to compensate for. Also the varying nature of PDL with respect to individual signals within a network also makes PDL difficult to compensate for.

Figure 2:
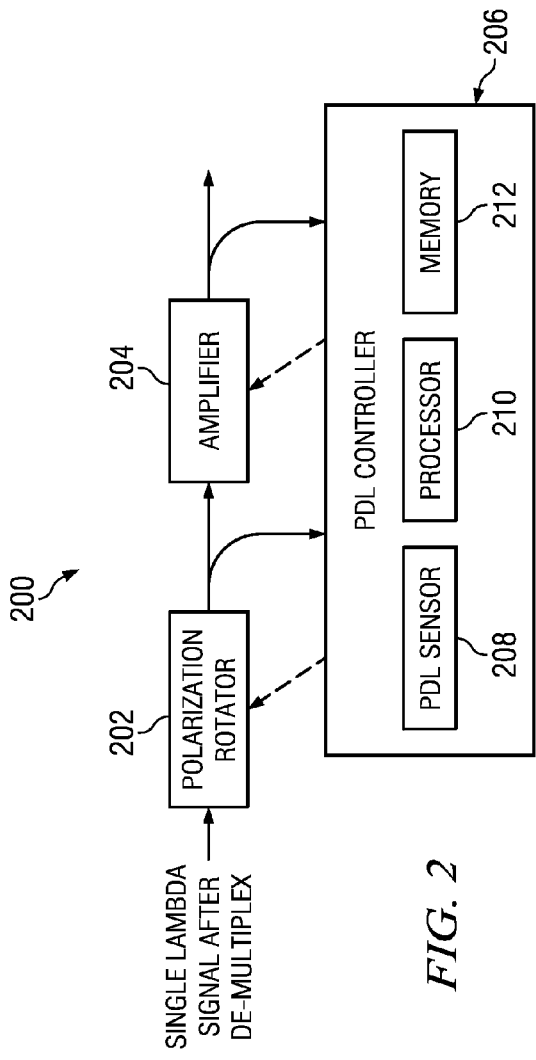
FIG. 2 illustrates an example system that may compensate for polarization dependent loss of a network.

FIG. 2 illustrates an example system 200 that may overcome some of these difficulties and compensate for polarization dependent effects of a network, such as network 101 in FIG. 1. To account for the wavelength dependency of polarization dependent effects, system 200 may be implemented after a WDM signal has been de-multiplexed into individual, single channel signals. For example, with respect to FIG. 1 and network 101, system 200 may be included in each receiver 112, or system 200 may be included in separate, independent, components, coupled between demultiplexer 105 and each receiver 112. Accordingly, each system 200 may compensate for the different PDL experienced by each wavelength.

Although described as being implemented with respect to receivers in an optical network, system 200 may be implemented in other locations of a network. For example, system 200 may be implemented after each network element that introduces polarization dependent effects, (e.g. after each OADM) after one or more network elements that introduce polarization dependent effects or after a plurality of network elements that introduce small polarization dependent effects and after each network element that introduces large polarization dependent effects in the system.

System 200 may include a polarization rotator 202, an optical amplifier 204, and a PDL controller 206. Polarization rotator 202 may be any system, apparatus or device configured to adjust or rotate the polarization state of an optical signal. Polarization rotator 202 may also be configured to change the amount of rotation of the signals that pass through it. Although described as a polarization rotator, rotator 202 may comprise a polarization controller that may perform a plurality of other functions also.

Amplifier 204 may be coupled to rotator 202 and may receive signals leaving rotator 202. Amplifier 204 may be any system, apparatus or device configured to amplify optical signals. Amplifier 204 may also have a PDG that may be utilized to offset the PDL of signals traveling through a network, such as network 101. Accordingly, the typically undesirable PDG of amplifier 204 may be utilized to offset the PDL experienced by the signals traveling through a network. In one embodiment, amplifier 204 may comprise a semiconductor optical amplifier (SOA) having PDG.

PDL controller 206 may be coupled to rotator 202 and amplifier 204. PDL controller 206 may comprise any system, apparatus or device configured to determine and compensate for the PDL of signals passing through a network.

PDL controller 206 may include a PDL sensor 208. PDL sensor 208 may be any system apparatus or device configured to measure the power of an optical signal at various orientations of the polarization state of the signal. For example, PDL sensor may be configured to measure the x-polarization component of a signal, the y-polarization component of a signal, the x-y component of the signal halfway between the x and y axes etc. In some instances, PDL sensor 208 may comprise a polarization controller that may perform a variety of other functions also, such as an Agilent 8169A polarization controller.

PDL controller 206 may also include a processor 210 coupled to PDL sensor 208 and configured to determine the PDL of signals after the signals pass through amplifier 204. Processor 210 may determine the PDL of the signals based on the power at various polarization components of the signal as measured by PDL sensor 208. Processor 210 may comprise any system apparatus or device configured to perform operations of one or more of the components of a network element or direct other network elements to perform operations or any combination thereof. Processor 210 may comprise hardware, software or any combination of both.

Processor 210 may be coupled to a memory 212. Memory 212 may comprise any system, apparatus or device configured to store information. Memory 212 may store instructions and operations for processor 210 to perform and may also store information as directed by processor 210. Although PDL controller is shown as having one processor 210, one memory 212 and one PDL sensor 208, the present disclosure should not be limited to such. For example, PDL sensor 208 may also include its own processor 210 and memory 212 to perform various operations such as determining the PDL of signals. Additionally, although shown as discrete components, processor 210 and memory 212 may be included in an individual component such as a control unit. Also, each of the various other components included in a network element may include an individual control unit for that component.

In some embodiments, PDL sensor 208 may measure the signal power at various polarization components of signals within the network. PDL sensor 208 may be configured to tap into a portion of the power and may measure the power at various polarization components of the polarization state of the signal. For example, a signal may include a polarization state and be traveling in the z-direction. The polarization state may comprise polarization components that are perpendicular to the incidence of travel of the signal (e.g., in the x-y plane). PDL sensor 208 may measure the tapped power of the signal of the polarization state at the x-axis, at the y-axis and at a series of locations between the x and y axes.

Additionally, processor 210 may direct storage of the measured power at the various polarization state locations in memory 212. Additionally, processor 210 may determine the lowest power measured and the highest power measured based off of the values stored in memory 212.

The power measurement may indicate that one polarization component has experienced a higher degree of loss than another polarization component. Accordingly, one polarization component may be a high loss polarization component and another may be a low loss polarization component. The orientation of the high loss polarization component may be referred to as the high loss axis of the PDL and the orientation of the low loss polarization component may be referred to as the low loss axis of the PDL.

For example, for the signal having a polarization state traveling in the z-direction, the power measurements may indicate that the polarization components oriented along the y-axis experience the highest amount of loss, and the polarization components oriented along the x-axis experience the lowest amount of loss. Accordingly, the y-axis may be the high loss axis of the PDL, and the x-axis may be the low loss axis of the PDL.

The difference between the highest measured power value and lowest measured power value may be a representation of the PDL of the signal as it passes through a network. The difference between the two indicates how the power of one polarization component has been affected by the various elements of the network compared to the power of another polarization component, and thus may represent the PDL. In the present embodiment, PDL sensor 208 and PDL controller 206 may be configured to measure and determine the PDL of signals both entering and exiting amplifier 204.

PDL controller 206 may be coupled to amplifier 204 and may be configured to adjust the PDG of amplifier 204 such that the PDG of amplifier 204 corresponds with the measured PDL of the signals entering amplifier 204. Similar to the high and low loss axes of PDL, the PDG of amplifier 204 may have a high gain axis and a low gain axis, such that one polarization component may be amplified more than another polarization component. By adjusting the PDG to approximately equal the PDL of the signal before the signal enters the amplifier, the difference between the amplification at the high gain axis and low gain axis of amplifier 204 may be approximately the same as the difference between the attenuation at the high loss axis and low loss axis of the measured PDL. Thus, the amount of PDG may be set to offset the amount of PDL of the signals entering amplifier 204.

PDL controller 206 may adjust the PDG of amplifier 204 by adjusting the current sent to amplifier 204. Amplifier 204 may be a semiconductor optical amplifier whose PDG may be proportional to the gain of the amplifier. The gain of the amplifier may be proportional to the amount of current sent to the amplifier. Therefore, the PDG may be in proportion to the amount of current sent to the amplifier. The correlation between the PDG, gain and current of the amplifier may be determined from data sheets or taking measurements using methods well known in the art. This correlation may be stored in memory 212. After determining the PDL of the signal before the signal enters amplifier 204, processor 210 may calculate the amount of current needed to be sent to amplifier 204 such that the PDG of amplifier 204 approximately equals the calculated PDL. Accordingly, processor 210 may direct PDL controller 206 to adjust the current sent to amplifier 204 to be approximately the same as the calculated current to obtain the desired PDG of amplifier 204 to offset the PDL of the signals entering amplifier 204.

Along with adjusting the PDG of amplifier 204 to approximately equal the PDL of the signal entering amplifier 204, PDL controller 206 may also be coupled to and control rotator 202 to rotate the polarization of signals to further compensate for the PDL of the system. As mentioned above, the PDG of amplifier 204 may have a low gain axis and a high gain axis, and the signals may have a low loss polarization component and a high loss polarization component associated with the low and high loss axes of the PDL. PDL controller 206 may direct polarization rotator 202 to rotate the polarization of the signals entering the amplifier such that the high loss polarization component of the signal may be better aligned with the high gain axis of the PDG of the amplifier 204 and also such that the low loss polarization component of the signal may be better aligned with the low gain axis of the PDG of the amplifier.

Accordingly, the polarization component that experiences the highest loss may be amplified the most and the polarization component that experiences the lowest loss may be amplified the least, thus reducing the signal strength difference between the high and low loss polarization components and the overall PDL of the signal. Accordingly, the PDG effects of amplifier 204 may compensate for and offset the PDL experienced by signals passing through the network.

PDL controller 206 may be configured to determine the proper rotation of the polarization states of the signals according to the PDL of the signals as the signals leave amplifier 204. PDL controller 206 may be configured to measure the PDL of the signals as they leave amplifier 204 using PDL sensor 208 and processor 210. Processor 210 may be configured to direct that the measured PDL be stored in memory 212. Additionally, PDL controller 206, using processor 210, may direct polarization rotator 202 to rotate the polarization of the signals by an incremental amount. Additionally, polarization controller 206 may use processor 210, PDL sensor 208 and memory 212 to measure and store the PDL of the rotated signals and the rotation associated with the measured PDL. Polarization controller 206 may continue directing rotation of the polarization states of signals by rotator 202, and measuring and storing the PDL associated with each rotation until enough measurements have been taken to determine at which rotation or rotation setting produces the least amount of PDL. The rotation that produces the least amount of PDL may correspond with the optimum orientation of the high and low loss polarization components of the signals with respect to the high and low gain axes of the PDG. After determining the proper rotation to achieve minimum PDL, PDL controller 206 may direct that polarization rotator 202 rotate the signals according to that rotation.

For example, PDL controller 206 may measure and store the PDL of signals leaving amplifier 204 with polarization rotator 202 applying no rotation to the signals. PDL controller 206 may then direct polarization rotator 202 to rotate the polarization of signals by ten degrees. PDL controller 206 may measure and store the PDL of the signals leaving amplifier 204 with a ten degree rotation along with the rotation of ten degrees. Therefore the measured PDL of signals with a ten degree rotation may also be associated with the rotation of ten degrees.

After storing the measured PDL at ten degrees, PDL controller 206 may direct polarization rotator 202 to rotate the signals another ten degrees, such that the signals now may have a total rotation of twenty degrees. PDL controller 206 may measure and store the PDL of the signals with a twenty degree rotation along with the rotation of twenty degrees. PDL controller 206 may continue incrementally rotating the signals by ten degrees and measuring and storing the PDL associated with each rotation until the signals have been rotated a full one-hundred eighty degrees, which may put the polarization states back to their originally measured position.

Once an adequate sampling of the PDL at various orientations of the high and low loss components of the polarization states has been done, processor 210 may be configured to determine the minimum PDL of the measured PDLs. Additionally, processor 210 may determine at which rotation the minimum PDL occurred. Accordingly, processor 210 may be configured to direct polarization rotator 202 to rotate the signals at the optimum rotation determined from the minimum PDL. As mentioned before, the rotation of the signals may help reduce the PDL by better aligning the high and low loss polarization components of the signals with the high and low gain axes of the PDG such that the PDG helps cancel out the effects of the PDL.

Although the present description is described with respect to rotating polarization by ten degree increments and measuring and storing PDL according to that rotation, the present disclosure should not be limited to such. For example, rotational increments may be greater than or less than the ten degrees described. Additionally, the optimum rotation to produce the least amount of PDL may be determined in a manner other than measuring and storing PDL and determining the minimum PDL based on these measurements.

Modifications, additions or omissions may be made to system 200 without departing from the scope of the disclosure. For example, although discreet individual steps are described—such as measuring PDL before the amplifier to adjust PDG and measuring PDL after the amplifier to adjust the rotation—are separately described, system 200 may perform these functions at the same time. Additionally, system 200 may be configured to constantly monitor the PDL of signals to change the PDG and rotation due to constant changes in PDL experienced by signals in the network. In other embodiments, system 200 may periodically monitor PDL and change the PDG and rotation accordingly. These configurations may depend on network requirements and characteristics.

Also, in some instances the rotation of the signals may be performed before the adjustment of the PDG of amplifier 204, or the rotation and adjustment of PDG may be performed at the same time. In yet other embodiments, PDL controller 206 may adjust the rotation of the signals but not adjust the PDG of amplifier 204.

Figure 3C:
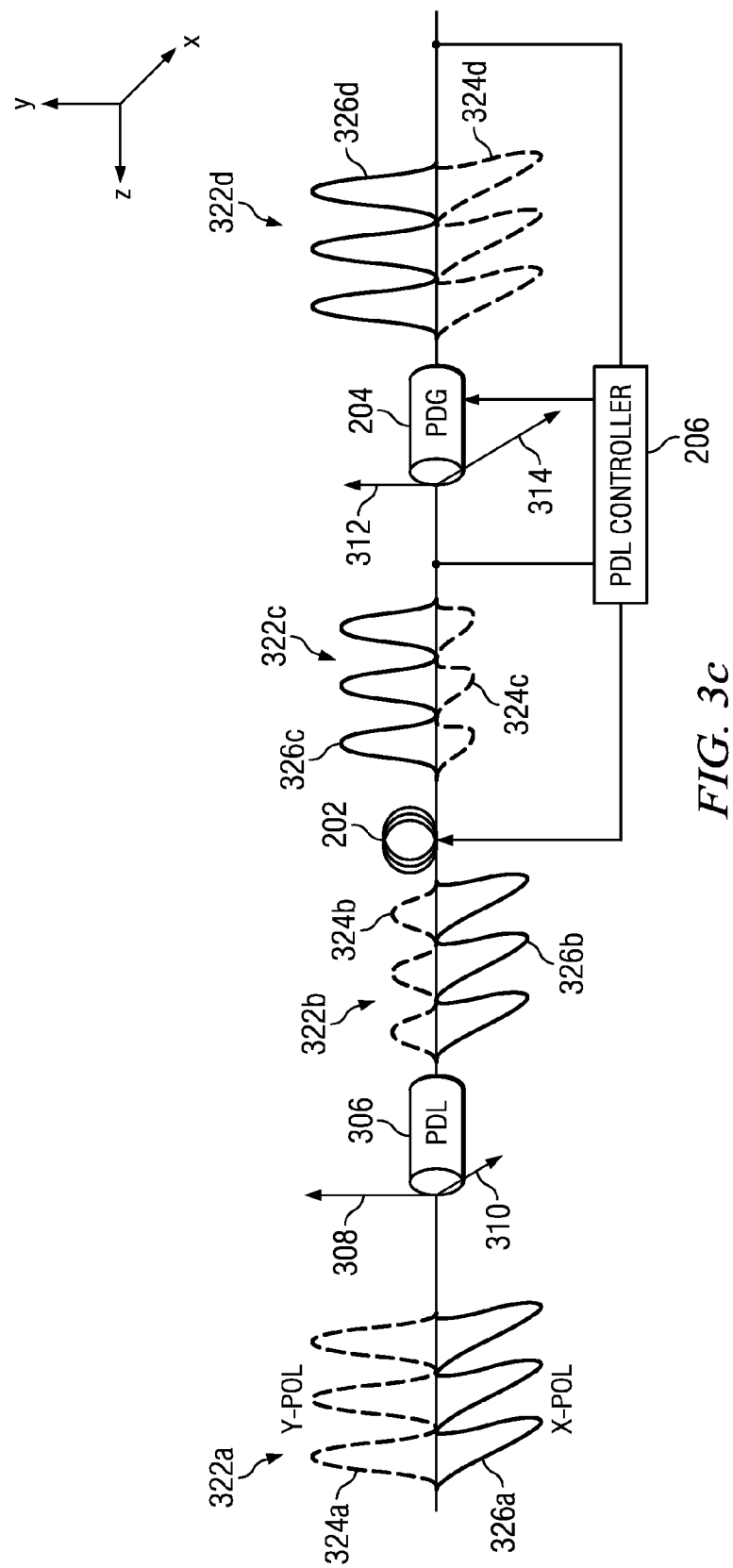
FIG. 3c illustrates how the PDG of the amplifier may be utilized to compensate for PDL by rotating the polarization state of a signal.

FIGS. 3a-3c illustrate an example of how using PDG of the amplifier may help compensate for PDL experienced by signals traveling through a network, such as network 100. FIGS. 3a-3c each depict a different operation performed by a PDL compensation system, such as system 200 described with respect to FIG. 2. FIGS. 3a-3c are depicted such that the PDL compensation system performs the various functions in a sequential manner on separate signals, however the present disclosure should not be limited to such. The purpose of showing the functions in an individual, sequential manner applied to separate signals is to facilitate an understanding of how each of the functions performed by the PDL compensation system may use the PDG of optical amplifiers to compensate for the PDL. The functions may be performed in a different order than that described, or in other instances may be performed at the same time.

FIG. 3a generally illustrates the effects of PDL on a signal traveling through a network and also describes measurement of that PDL by the PDL compensation system. FIG. 3b illustrates how the PDL compensation system may use the measured PDL from FIG. 3a to adjust the PDG of the amplifier to help compensate for the PDL. Additionally, FIG. 3c illustrates how the PDL compensation system may rotate the polarization of signals to further utilize the PDG to compensate for the effects of PDL on signals traveling through the network.

In FIG. 3a, a signal 300 may travel through a network that produces PDL effects on signal 300. Signal 300a may enter the network and may travel along the z-axis in the network. Signal 300a may include a polarization component 302a oriented along the y-axis and a polarization state 304a oriented along the x-axis. Use of the x, y and z axes in the present example are for illustrative purposes only. Signals may travel along any axis at any direction and may include polarization states oriented along any plane perpendicular to the direction of incidence of the signal without departing from the scope of the disclosure. Polarization component 302a may be modulated with traffic and polarization component 304a may also be modulated with traffic to be carried throughout the network. Additionally, before encountering any PDL effects, the signal power of polarization components 302a and 304a may be equal.

As signal 300a travels through the network, it may experience various polarization dependent effects caused by PDL elements 306 included in the network. The PDL caused by PDL elements 306 may include a high loss axis 308 of PDL and a low loss axis 310 of PDL. In the present example, high loss axis 308 may be along the y-axis and low loss axis 310 may be along the x-axis, such that the y-polarization of signals experiences the highest amount of loss and the x-polarization of signals experiences the lowest amount of loss. Therefore, polarization component 302a may experience more loss than polarization component 304a because polarization component 302a may be along the high loss y-axis and polarization component 304a may be along the low loss x-axis.

Signal 300b depicts how the PDL of PDL elements 306 may affect signal 300a. Due to the greater loss along the y-axis than along the x-axis, polarization component 302b may have a lower signal power than polarization component 304b, such that polarization component 302b may be a high loss polarization component and polarization component 304b may be a low loss polarization component. Signal 300b may then enter a PDL compensation system such as system 200 described with respect to FIG. 2, where signal 300b may enter polarization rotator 202.

In the present example, polarization rotator 202 may be configured such that the polarization of signal 300b is not yet rotated, thus signal 300c (leaving polarization rotator 202) with high and low loss polarization components 302c and 304c may be substantially identical to signal 300b with high and low loss polarization components 302b and 304b. Signal 300c may then be sent to amplifier 204.

PDL controller 206 may measure the PDL of signal 300c before signal 300c enters amplifier 204. The difference in signal power between high loss polarization component 302c and low loss polarization component 304c may be used to calculate the PDL of signal 300c. After measuring the PDL of signal 300c, PDL controller may use the measured PDL of signal 300c to adjust the PDG of amplifier 204. In the present example, however, signal 300c may pass through amplifier 204 before PDL controller adjusts the PDG of amplifier 204.

The PDG of amplifier 204 may include a low gain axis 312 and a high gain axis 314. The difference between the low gain axis 312 and high gain axis 314 may be used to represent the PDG of amplifier 204. In the present example, it may be seen that PDL controller 206 has not adjusted the PDG of amplifier 204 yet because the depicted difference between high gain axis 314 and low gain axis 312 is not shown to be related to the difference between high loss axis 308 and low loss axis 310. This adjustment is further discussed with respect to FIG. 3b.

In the present example, low gain axis 312 may be along the y-axis and high gain axis 314 may be along the x-axis, such that the y-polarization of signals entering amplifier 204 experiences the lowest amount of gain and the x-polarization of signals entering amplifier 204 experiences the highest amount of gain. Amplifier 204 may amplify high loss polarization component 302c less than low loss polarization component 304c because polarization component 302c may be oriented with the low gain axis and polarization component 304c may be oriented with the high gain axis.

Signal 300d depicts signal 300 as it is leaving amplifier 204. Due to the orientation of high and low loss polarization components 302c and 304c with respect to high and low gain axes 314 and 312, the polarization component that needed the most amplification, high loss component 302c, was amplified the least, and the polarization component that needed the least amplification, low loss component 304c, was amplified the most, as shown by polarization components 302d and 304d. Accordingly, it may be seen that rotating the polarization components of signal 300 such that high loss components 302 are amplified the most after experiencing the most loss and low loss components 304 are amplified the least after experiencing the least loss may also be performed. The rotation to achieve this result is further discussed with respect to FIG. 3c.

FIG. 3b illustrates how the PDL compensation system may use the measured PDL from FIG. 3a to adjust the PDG of the amplifier to help compensate for the PDL. Signal 316 may travel through the network after PDL controller has adjusted the PDG of amplifier 204. Signal 316 may be substantially similar to signal 300 in FIG. 3a and may include polarization components 318 and 320, respectively similar to polarization components 302 and 304 of signal 300.

In FIG. 3b, the PDL of the network may not have changed due to switching or other factors such that high and low loss axes 308 and 310 are the same in FIG. 3b as FIG. 3a. Also, PDL controller 206 may not have begun directing rotator 202 to begin rotating any signals yet. Accordingly, signals 316a, 316b and 316c may be substantially similar to signals 300a, 300b, and 300c in FIG. 3a.

Unlike in FIG. 3a, however, PDL controller 206 may have adjusted the PDG of amplifier 204 to approximate the measured PDL of signals entering amplifier 204. Accordingly, high gain axis 314 and low gain axis 312 in FIG. 3b are depicted as having different sizes than high and low gain axes 314 and 312 in FIG. 3a. Additionally, high gain axis 314 is shown to be the same size as high loss axis 308 and low gain axis 312 is shown to be the same size as low loss axis 310. Thus, the difference between the high and low gain axes 314 and 312 is approximately equal to the difference between high and low loss axes 308 and 310. High and low loss axes 308 and 310 of the PDL create the power difference between the high and low loss polarization components of signals. Accordingly, FIG. 3b depicts that the PDG has been adjusted to be approximately equal to the measured PDL by depicting that high gain axis 314 is approximately the same size as high loss axis 308, and by depicting that low gain axis 312 is approximately the same size as low loss axis 310.

However, FIG. 3b also depicts that without rotation of the polarization states of signal 316c such that the orientation of high and low loss polarization components 318c and 320c are better aligned with high and low gain axes 314 and 312 of amplifier 204, the PDL of signal 316c may not be compensated for. In fact, in some instances, adjusting the PDG to equal the PDL without rotation may make the PDL of the signal even worse. FIG. 3b depicts this scenario as shown by signal 316d, where the difference between polarization components 318d and 320d is shown to be greater than the difference between polarization components 318c and 320c. Thus, the overall PDL of signal 316d may be greater than the overall PDL of signal 316c. Therefore, rotation of the polarization states of signals to compensate for PDL may also be required.

PDL controller 206 may measure the PDL of signal 316d after signal 316d leaves amplifier 204 and may use that measurement to direct rotator 202 to rotate the polarization states of the signals entering amplifier 204 such that the PDG of amplifier 204 may better compensate for the PDL.

FIG. 3c depicts how the PDL compensation system may rotate the polarization of signals to further utilize the PDG of an amplifier to compensate for the effects of PDL on signals traveling through the network. Signal 322 may travel through the network depicted in FIG. 3c after the PDG of amplifier 204 has been adjusted. Signal 322 may be substantially similar to signals 300 and 316 depicted in FIGS. 3a and 3b and may include polarization components 324 and 326, respectively similar to polarization components 302 and 304 of signal 300 and polarization components 318 and 320 of signal 316.

Signal 322a may enter the network in FIG. 3c and the network may include PDL elements 306 that create PDL effects on the polarization components 322a and 324a of signal 322a due to high and low loss axes 308 and 310, similar to that described in FIGS. 3a and 3b with respect to signals 300 and 316. The PDL effects may be seen in signal 322b with high loss polarization component 324b and low loss polarization component 326b.

However, unlike in FIGS. 3a and 3b, PDL controller 206 may have been directing polarization rotator 202 to rotate signals before the signals enter amplifier 204 and also measuring the PDL of those signals as they leave amplifier 206. Accordingly, PDL controller 206 may have determined at which rotation or rotational setting that the orientation of high and low loss components 324b and 326b would be optimally aligned with high and low gain axes 314 and 312.

In the present example, high loss polarization component 324b may be oriented along the y-axis and low loss polarization component 326b may be oriented along the x-axis. Additionally, in the present example, high gain axis 314 of the PDG may be along the x-axis and low gain axis 312 of the PDG may be along the y-axis. To optimally compensate for the PDL, the polarization component with the highest loss (component 324b, which is oriented with the y-axis) should be amplified the most, which means ideally it would be aligned with high gain axis 314 (which is oriented with the x-axis). Also, the polarization component with the lowest loss (component 326b, which oriented with the x-axis) should be amplified the least, which means ideally it would be lined up with low gain axis (which is oriented with the y-axis in the present example). Accordingly, PDL controller 206 may have determined that to optimally compensate for the PDL effects of PDL elements 306, using the PDG of amplifier 204, polarization controller 202 may rotate the polarization states of signals entering rotator 202, such as signal 322b, ninety degrees.

Signal 322c depicts the effect of the rotation of the polarization state of signal 322b. In signal 322c, low loss polarization component 326c is now oriented along the y-axis, whereas low loss polarization component 326b is oriented along the x-axis. Similarly, high loss polarization component 324c is oriented along the x-axis, whereas high loss polarization component 324b is oriented along the y-axis. Due to the rotation of the polarization state of signal 322, high loss polarization component 324c is now aligned with high gain axis 314. Additionally, low loss polarization component 326c is now aligned with low gain axis 312. Additionally, as described with respect to FIGS. 3a and 3b, the PDG of amplifier 204 may be approximately equal to the PDL of signal 322c due to the adjustment of the PDG by PDL controller 206.

With high loss component 324c aligned with high gain axis 314 and low loss component aligned with low gain axis 312, and with the PDG set to the PDL of signal 322c, the PDG of amplifier 204 may optimally compensate for the PDL caused by PDL elements 306. As shown by signal 322d, low loss polarization component 326c has been amplified less than high loss polarization component 324c; such that power levels of polarization components 324d and 326d are substantially equal. With the power levels of polarization components 324d and 326d being substantially equal, the difference between the power levels may be very small, thus signal 322d may have very little to no PDL. Therefore, the PDG of the amplifier may be used to compensate for the PDL experienced by signals.

Differences between what is described with respect to FIGS. 3a-3c may occur without departing from the scope of the disclosure. FIGS. 3a-3c merely illustrate how PDG of an amplifier may compensate for PDL. The degree of rotation, the orientation of the high and low loss axes, the orientation of the high and low gain axes, the degree that the magnitude of the PDG may be adjusted to compensate for the magnitude of the PDL and the degree that the high and low loss polarization components may be rotated to align with the high and low gain axes of the amplifier may all vary without departing from the scope of the present disclosure.

Additionally, although each step has been described as occurring in a particular, sequential manner, the present disclosure is not limited to such. For example, PDL controller 206 may adjust the PDG of amplifier 204 at the same time that it is adjusting the rotation of rotator 202, or PDL controller may adjust the rotation of rotator 202 and then adjust the PDG of amplifier 204.

Also, PDL controller 206 may be configured to constantly monitor the PDL of signals and adjust accordingly or it may be configured to monitor and adjust for the PDL on a periodic basis depending on the specific characteristics and requirements of the network to which it is utilized. These characteristics may include the amount of switching that occurs in the network that may add or remove signals experiencing varying degrees of PDL based on the different network elements encountered by the individual signals.

Figure 4:
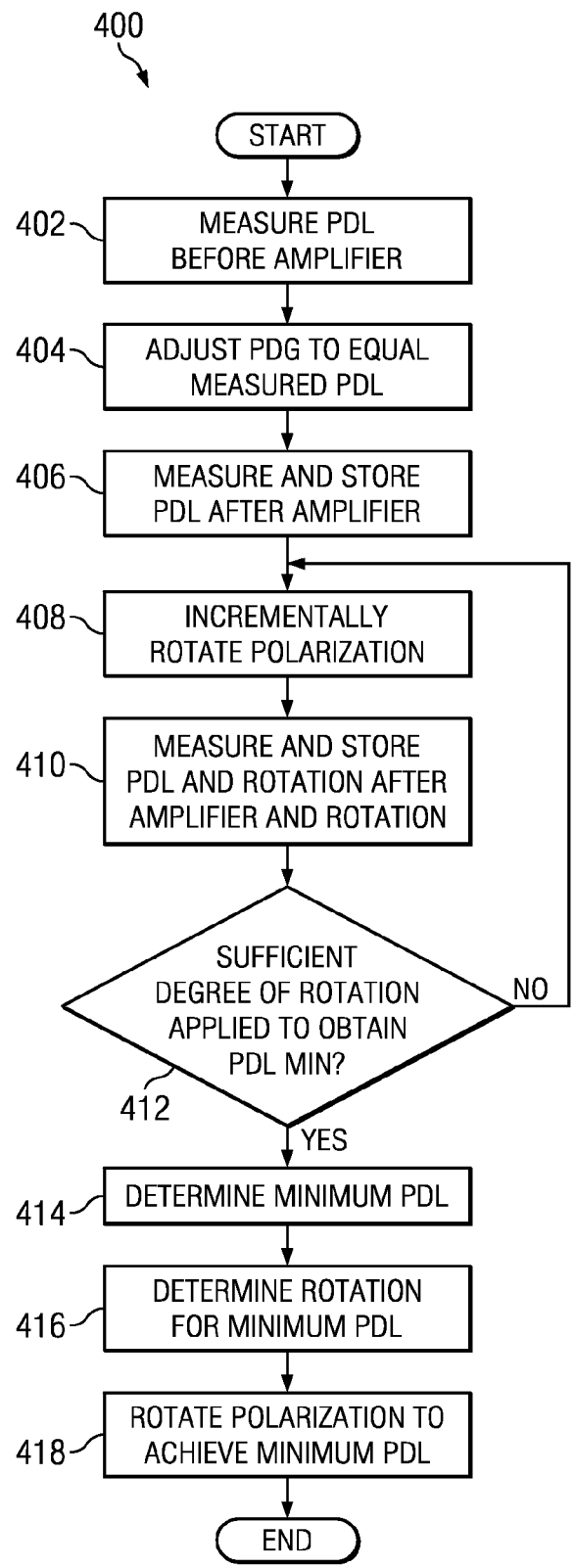
FIG. 4 illustrates an example method for compensating for the PDL of a network using the PDG of an amplifier.

FIG. 4 illustrates an example method 400 for compensating for the PDL of an optical network using the PDG of an optical amplifier. A PDL compensation system, such as system 200 described with respect to FIG. 2 may perform the method, or any other system apparatus or device appropriately configured may also perform the steps.

Method 400 may begin at step 402 where a PDL controller (e.g., PDL controller 206) may measure the PDL of signals before the signals enter an optical amplifier having PDG (e.g., amplifier 204). At step 404, the PDL controller may adjust the PDG of the amplifier, such that the PDG is approximately equal to the measured PDL.

At step 406, the PDL controller may measure and store the PDL of the signal as the signal is leaving the amplifier, but before directing that any rotation of the polarization state of signals entering the amplifier be performed.

At step 408, the PDL controller may direct a polarization rotator (e.g., rotator 202) to incrementally rotate the signals before the signals enter the amplifier. This rotation may be any suitable amount of rotation according to the characteristics and requirements of the system. For example, rotating by increments of ten degrees may be sufficient in some networks, whereas rotations by increments of only one degree may be necessary in other networks.

At step 410, the PDL controller may determine and store the PDL of the rotated signals after the signals leave the amplifier. The PDL controller may also determine and store the amount of rotation associated with the measured PDL. In other embodiments, the rotational setting of the rotator associated with a particular rotation may be stored.

At step 412, the PDL controller may determine if it has measured and stored the PDL at a sufficient number of polarization orientations due to polarization rotations to determine at what orientation the minimum PDL occurs. In some embodiments, PDL controller may rotate the polarization states of signals and measure the PDL at various orientations until it has rotated the polarization states by a complete rotation. If the PDL controller determines that a sufficient number of PDL measurements have been taken at various polarization orientations, the PDL controller may proceed to step 414. Otherwise, the PDL controller may return to step 408 to continue rotating signals and measuring the PDL associated with the rotations.

At step 414, the PDL controller may determine the minimum PDL, which may correspond with the best alignment of high and low loss polarization components with the high and low gain axes of the PDG of the amplifier. At step 416, the PDL controller may determine the rotation that achieved the polarization orientation to create the minimum PDL. The PDL controller may determine this merely by comparing the minimum PDL with the stored rotation setting associated with the minimum PDL.

At step 418, the PDL controller may set the rotation setting of the polarization rotator to the ascertained optimal rotation for achieving minimum PDL. Thus the PDG of the amplifier may help compensate for the PDL of a system. Following step 418, method 400 may end.

Modifications, additions or omissions may be made to method 400 without departing from the scope of the present disclosure. For example, steps 402 and 404 may be performed while simultaneously performing steps 406-418.

Although the present disclosure and its advantages have been described in detail, it should be understood that various changes, substitutions and alterations can be made herein without departing from the spirit and scope of the disclosure as defined by the following claims.

What is claimed is:

1. A system for compensating for polarization dependent loss experienced by an optical signal comprising:
    an optical amplifier configured to amplify an optical signal and having a polarization dependent gain (PDG);
    a polarization rotator coupled to the amplifier and configured to rotate the polarization of the optical signal before the signal enters the amplifier; and
    a polarization dependent loss (PDL) controller coupled to the amplifier and rotator and configured to:
        determine a post-amplifier PDL of the optical signal as the optical signal leaves the optical amplifier; and
        control the rotator to rotate the polarization of the optical signal based on the post-amplifier PDL such that the PDG of the amplifier compensates for the PDL experienced by the optical signal;
        wherein the signal includes a high loss polarization component and a low loss polarization component and wherein the PDL controller is further configured to determine the post-amplifier PDL of the signal by comparing power levels of the high and low loss polarization components of the signal as the signal leaves the amplifier.

2. The system of claim 1, wherein the PDL controller is further configured to:
    determine a pre-amplifier PDL of the signal before the signal enters the amplifier; and
    adjust the PDG of the amplifier based on the pre-amplifier PDL.

3. The system of claim 2, wherein the PDL controller is further configured to adjust the PDG to be approximately equal to the pre-amplifier PDL.

4. The system of claim 2, wherein the signal includes a high loss polarization component and a low loss polarization component and wherein the PDL controller is further configured to determine the pre-amplifier PDL of the signal by comparing power levels of the high and low loss polarization components of the signal before the signal enters the amplifier.

5. The system of claim 1, wherein the PDL controller is further configured to:
    determine a rotation of the polarization of the optical signal that provides a reduction of the PDL; and
    control the rotator to rotate the polarization based on the determined rotation.

6. The system of claim 5, wherein the PDL controller is further configured to control the rotator to incrementally rotate the polarization of the signal to determine the rotation of the polarization of the optical signal that provides a reduction of the PDL.

7. The system of claim 5, wherein the PDL controller is further configured to determine a minimum measured post-amplifier PDL of the signal based on a plurality of post-amplifier PDL measurements associated with a plurality of polarization rotations.

8. The system of claim 7, wherein the PDL controller is further configured to:
    determine the polarization rotation associated with the measured minimum post-amplifier PDL; and
    control the rotator to rotate the polarization of the signal based on the polarization rotation associated with the measured minimum post-amplifier PDL.

9. The system of claim 1, wherein the PDG includes a high gain axis and a low gain axis, the signal includes a high loss polarization component and a low loss polarization component and wherein the PDL controller is further configured to direct the rotator to rotate the polarization of the signal such that the high loss polarization component is substantially aligned with the high gain axis and the low loss polarization component is substantially aligned with the low gain axis.

10. The system of claim 1, wherein the amplifier comprises a semiconductor optical amplifier (SOA).

11. A method for compensating for polarization dependent loss experienced by an optical signal comprising:
    determining a post-amplifier polarization dependent loss (PDL) of a signal leaving an optical amplifier having a polarization dependent gain (PDG), wherein the signal includes a high loss polarization component and a low loss polarization component and wherein determining the post-amplifier PDL of the signal comprises comparing power levels of the high and low loss polarization components of the signal as the signal leaves the amplifier; and
    rotating the polarization of the optical signal based on the post-amplifier PDL such that the PDG of the amplifier compensates for the PDL experienced by the signal.

12. The method of claim 11, further comprising:
  determining a pre-amplifier PDL of the signal before the signal enters the amplifier; and
  adjusting the PDG of the amplifier based on the pre-amplifier PDL.

13. The method of claim 12, further comprising adjusting the PDG to be approximately equal to the pre-amplifier PDL.

14. The method of claim 12, wherein determining the pre-amplifier PDL of the signal comprises comparing a power level of a high loss polarization component with a power level of a low loss polarization component of the signal before the signal enters the amplifier.

15. The method of claim 11, further comprising:
  determining a rotation of the polarization of the optical signal that provides a reduction of the PDL experienced by the signal; and
  rotating the polarization based on the determined rotation.

16. The method of claim 15, wherein determining the rotation of the polarization further comprising incrementally rotating the polarization of the signal.

17. The method of claim 15, further comprising determining a minimum measured post-amplifier PDL of the signal based on a plurality of post-amplifier PDL measurements associated with a plurality of polarization rotations.

18. The method of claim 17, further comprising:
  determining the polarization rotation associated with the measured minimum post-amplifier PDL; and
  rotating the polarization of the signal based on the polarization rotation associated with the measured minimum post-amplifier PDL.

19. The method of claim 11, further comprising rotating the polarization of the signal such that a high loss polarization component of the signal is substantially aligned with a high gain axis of the PDG and such that a low loss polarization component of the signal is substantially aligned with a low gain axis of the PDG.

* * * * *